(12) United States Patent
Ogata

(10) Patent No.: US 7,786,793 B2
(45) Date of Patent: Aug. 31, 2010

(54) SEMICONDUCTOR INTEGRATED CIRCUIT

(75) Inventor: Hiromi Ogata, Kanagawa (JP)

(73) Assignee: Sony Corporation, Tokyo (JP)

( * ) Notice: Subject to any disclaimer, the term of this patent is extended or adjusted under 35 U.S.C. 154(b) by 14 days.

(21) Appl. No.: 12/155,281

(22) Filed: Jun. 2, 2008

(65) Prior Publication Data

US 2009/0009238 A1 Jan. 8, 2009

(30) Foreign Application Priority Data

Jul. 2, 2007 (JP) ............................. 2007-174179

(51) Int. Cl.
*G05F 1/10* (2006.01)
(52) U.S. Cl. .................. 327/544; 327/530; 327/534
(58) Field of Classification Search ......... 327/108–112, 327/261, 263, 268–271, 276, 278–281, 374–377, 327/524, 530, 538, 541, 543, 544
See application file for complete search history.

(56) References Cited

U.S. PATENT DOCUMENTS

| | | | |
|---|---|---|---|
| 6,242,948 B1 * | 6/2001 | Makino | 326/81 |
| 7,436,206 B2 * | 10/2008 | Kurotsu | 326/34 |
| 2001/0013806 A1 * | 8/2001 | Notani | 327/534 |
| 2004/0108884 A1 * | 6/2004 | Morikawa | 327/530 |
| 2004/0208046 A1 * | 10/2004 | Yokozeki | 365/145 |
| 2008/0094889 A1 * | 4/2008 | Kurotsu | 365/181 |

FOREIGN PATENT DOCUMENTS

| | | |
|---|---|---|
| JP | 06-029834 | 2/1994 |
| JP | 2003-289245 | 10/2003 |
| JP | 2005-259879 | 9/2005 |

\* cited by examiner

*Primary Examiner*—Lincoln Donovan
*Assistant Examiner*—Shikha Goyal
(74) *Attorney, Agent, or Firm*—Rader, Fishman & Grauer PLLC

(57) ABSTRACT

Disclosed herein is a semiconductor integrated circuit including a stoppable circuit unit configured to be alternately switched between a stopped state and an operating state; a first voltage line configured to apply a first voltage to the stoppable circuit unit when the stoppable circuit unit is in the operating state; a second voltage line configured to apply the first voltage to the stoppable circuit unit when the stoppable circuit unit is in a transient state of switching from the stopped state to the operating state; and a third voltage line configured to apply a second voltage to the stoppable circuit unit.

16 Claims, 11 Drawing Sheets

SEMICONDUCTOR INTEGRATED CIRCUIT

CROSS REFERENCES TO RELATED APPLICATIONS

The present invention contains subject matter related to Japanese Patent Application JP 2007-174179 filed in the Japan Patent Office on Jul. 2, 2007, the entire contents of which being incorporated herein by reference.

BACKGROUND OF THE INVENTION

1. Field of the Invention

The present invention relates to semiconductor integrated circuits.

Specifically, the present invention relates to a semiconductor integrated circuit that decreases its power consumption by blocking a leakage current of a transistor in the stopped state.

2. Description of the Related Art

As a technique for decreasing the power consumption of a CMOS integrated circuit while preventing the lowering of the operating speed of MOS transistors, a multi-threshold complementary metal oxide semiconductor (MTCMOS) technique is known (refer to e.g. Japanese Patent Laid-Open Hei No. 6-29834).

For a logic circuit block to which the MTCMOS technique is applied, a virtual supply voltage line and a virtual reference voltage line are provided, and the logic circuit block is connected between these lines. The virtual supply voltage line and a supply voltage line are connected to each other via a switch transistor, and the virtual reference voltage line and a reference voltage line are also connected to each other via a switch transistor.

To the supply voltage line, a high-level voltage is applied via a power supply pad from a system power supply or the like outside the CMOS integrated circuit. To the reference voltage line, a low-level voltage (e.g. ground potential) is applied via a power supply pad from the system power supply or the like outside the CMOS integrated circuit.

The switch transistors are in the on-state when the logic circuit block to which the MTCMOS technique is applied is in the operating state, and are in the off-state when it is in the stopped state.

The threshold voltages of p-type MOS transistor and n-type MOS transistor used as the switch transistors are higher than those of p-type MOS transistor and n-type MOS transistor included in the logic circuit block.

Therefore, when the logic circuit block is in the stopped state, the leakage currents of the MOS transistors included in the logic circuit block are blocked by the switch transistors. On the other hand, when the logic circuit block is in the operating state, the MOS transistors included in the logic circuit block operate at high speed.

In another configuration of a logic circuit block to which the MTCMOS technique is applied, either one of a virtual supply voltage line and a virtual reference voltage line is provided. A switch transistor is used for the connection between the virtual supply voltage line and a supply voltage line or between the virtual reference voltage line and a reference voltage line.

As described above, switch transistors having high threshold voltages are included in a CMOS integrated circuit employing the MTCMOS technique. Therefore, the circuit layout of this CMOS integrated circuit is more difficult compared with a circuit for which the MTCMOS technique is not used. However, a layout method that can alleviate the difficulty has been proposed (refer to e.g. Japanese Patent Laid-Open No. 2005-259879).

However, the CMOS integrated circuit for which the MTCMOS technique is used involves the case in which a logic circuit block in the stopped state and a logic circuit block in the operating state simultaneously exist as logic circuit blocks to which the MTCMOS technique is applied. In addition, a logic circuit block also exists that does not employ the MTCMOS technique and is connected directly to supply voltage line and reference voltage line so as to be constantly in the operating state.

When the switch transistors for blocking leakage currents are turned on and the logic circuit block in the stopped state is switched to the operating state, a sudden current (hereinafter, referred to as an inrush current) temporarily flows in the transient state of this switching from the stopped state to the operating state. It is known that this inrush current leads to voltage changes on the supply voltage line and the reference voltage line and hence causes the erroneous operation and the lowering of the operating speed of the logic circuit blocks in the operating state.

A technique has been proposed to suppress the peak of this inrush current. In this technique, for a logic circuit block to which the MTCMOS technique is applied, plural switch transistors are used for each of the connections between a virtual supply voltage line and a supply voltage line and between a virtual reference voltage line and a reference voltage line, and these switch transistors are sequentially turned on with time lag (refer to e.g. Japanese Patent Laid-Open No. 2003-289245).

This method, in which plural switch transistors used for each of the connections between a virtual supply voltage line and a supply voltage line and between a virtual reference voltage line and a reference voltage line are turned on with time lag, is effective to suppress the peak of the inrush current. However, it takes a long time for this method to switch the state of the logic circuit block from the stopped state to the operating state. Therefore, this method is not preferable for a circuit desired to return to the operating state at high speed.

SUMMARY OF THE INVENTION

There is a need for the present invention to provide a semiconductor integrated circuit that allows the switching of a logic circuit block from the stopped state to the operating state in a short time while preventing the erroneous operation of a logic circuit block in the operating state due to an inrush current.

According to a mode of the embodiment of the present invention, there is provided a semiconductor integrated circuit that includes a stoppable circuit unit configured to be alternately switched between a stopped state and an operating state, a first voltage line configured to apply a first voltage to the stoppable circuit unit when the stoppable circuit unit is in the operating state, a second voltage line configured to apply the first voltage to the stoppable circuit unit when the stoppable circuit unit is in a transient state of switching from the stopped state to the operating state, and a third voltage line configured to apply a second voltage to the stoppable circuit unit. The stoppable circuit unit includes a circuit cell connected between the third voltage line and an internal voltage line, a first switch that isolates the second voltage line from the internal voltage line when the stoppable circuit unit is in the stopped state, and connects the second voltage line to the internal voltage line when the stoppable circuit unit is in the transient state, and a second switch that isolates the first voltage line from the internal voltage line when the stoppable circuit unit is in the stopped state and when the stoppable circuit unit is in the transient state, and connects the first voltage line to the internal voltage line when the stoppable circuit unit is in the operating state.

According to this mode of the embodiment of the present invention, when the stoppable circuit unit is in the stopped state, the first switch isolates the second voltage line from the internal voltage line, and the second switch isolates the first voltage line from the internal voltage line. Because the first voltage is not applied to the internal voltage line, a leakage current that flows through the circuit cell connected between the third voltage line and the internal voltage line is blocked.

When the stoppable circuit unit is in the transient state of switching from the stopped state to the operating state, the second switch isolates the first voltage line from the internal voltage line, whereas the first switch connects the second voltage line to the internal voltage line. An inrush current does not flow to the first voltage line but flows through the second voltage line. Therefore, the inrush current has no influence on other circuit units connected to the first voltage line.

When the stoppable circuit unit is in the operating state, the second switch connects the first voltage line to the internal voltage line. At this time, the stoppable circuit unit operates at high speed.

According to another mode of the embodiment of the present invention, there is provided a semiconductor integrated circuit that includes a stoppable circuit unit configured to be alternately switched between a stopped state and an operating state, a first voltage line configured to apply a first voltage to the stoppable circuit unit when the stoppable circuit unit is in the operating state, and a second voltage line configured to apply the first voltage to the stoppable circuit unit when the stoppable circuit unit is in a transient state of switching from the stopped state to the operating state. The semiconductor integrated circuit further includes a third voltage line configured to apply a second voltage to the stoppable circuit unit when the stoppable circuit unit is in the operating state, and a fourth voltage line configured to apply the second voltage to the stoppable circuit unit when the stoppable circuit unit is in the transient state. The stoppable circuit unit includes a circuit cell connected between a first internal voltage line and a second internal voltage line, a first switch that isolates the second voltage line from the first internal voltage line when the stoppable circuit unit is in the stopped state, and connects the second voltage line to the first internal voltage line when the stoppable circuit unit is in the transient state, and a second switch that isolates the first voltage line from the first internal voltage line when the stoppable circuit unit is in the stopped state and when the stoppable circuit unit is in the transient state, and connects the first voltage line to the first internal voltage line when the stoppable circuit unit is in the operating state. The stoppable circuit unit further includes a third switch that isolates the fourth voltage line from the second internal voltage line when the stoppable circuit unit is in the stopped state, and connects the fourth voltage line to the second internal voltage line when the stoppable circuit unit is in the transient state, and a fourth switch that isolates the third voltage line from the second internal voltage line when the stoppable circuit unit is in the stopped state and when the stoppable circuit unit is in the transient state, and connects the third voltage line to the second internal voltage line when the stoppable circuit unit is in the operating state.

As described above, the modes of the embodiment of the present invention allow the switching of a logic circuit block from the stopped state to the operating state in a short time while preventing the erroneous operation of a logic circuit block in the operating state due to an inrush current.

DETAILED DESCRIPTION OF THE PREFERRED EMBODIMENTS

Figure 1:
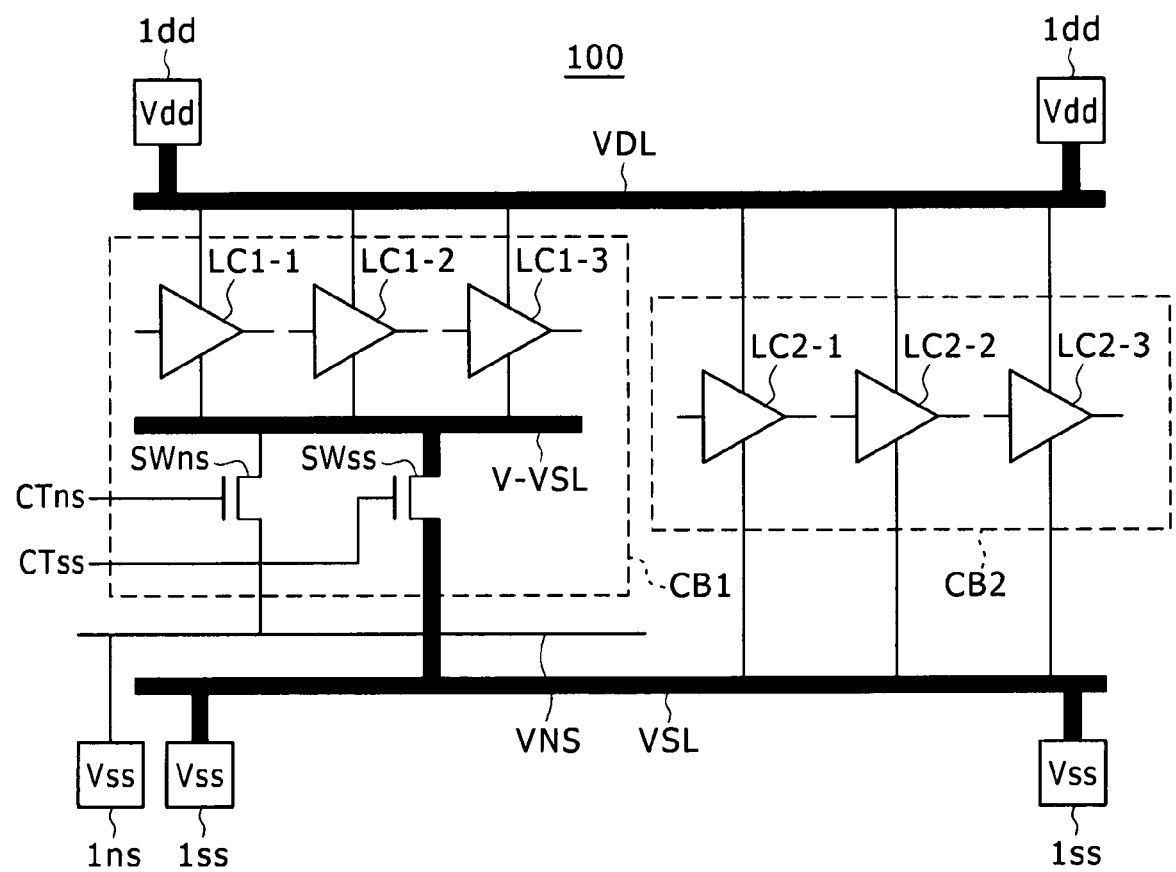
FIG. 1 is a diagram showing one example of a logic circuit block according to a first embodiment of the present invention.

FIG. 1 is a diagram showing one example of a logic circuit block according to a first embodiment of the present invention.

A CMOS integrated circuit 100 includes a logic circuit block CB1, a logic circuit block CB2, a supply voltage line VDL, a reference voltage line VSL, an inrush-current discharge line VNS, a power supply pad 1$dd$, a power supply pad 1$ss$, and a power supply pad 1$ns$.

The logic circuit block CB1 is a circuit block to which an MTCMOS technique is applied, whereas the logic circuit block CB2 is a circuit block to which the MTCMOS technique is not applied.

The logic circuit block CB1 is connected to the supply voltage line VDL, the reference voltage line VSL, and the inrush-current discharge line VNS. The logic circuit block CB2 is connected to the supply voltage line VDL and the reference voltage line VSL.

The supply voltage line VDL, the reference voltage line VSL, and the inrush-current discharge line VNS are connected to the power supply pad 1$dd$, the power supply pad 1$ss$, and the power supply pad 1$ns$. The power supply pads 1$dd$, 1$ss$, and 1$ns$ are supplied with power from a system power supply or the like provided on a mounting substrate when the CMOS integrated circuit 100 is mounted thereon. At this time, a high-level supply voltage Vdd is applied to the power supply pad 1*dd*, and a low-level reference voltage (e.g. ground potential) Vss is applied to the power supply pad 1*ss* and the power supply pad 1*ns*.

The logic circuit block CB1 includes a logic circuit cell LC1-1, a logic circuit cell LC1-2, a logic circuit cell LC1-3, a switch transistor SWns, a switch transistor SWss, and a virtual reference voltage line V-VSL.

The logic circuit cells LC1-1, LC1-2, and LC1-3 are connected between the supply voltage line VDL and the virtual reference voltage line V-VSL.

The switch transistor SWss controls the connection and disconnection between the virtual reference voltage line V-VSL and the reference voltage line VSL. Similarly, the switch transistor SWns controls the connection and disconnection between the virtual reference voltage line V-VSL and the inrush-current discharge line VNS. The switch transistor SWss and the switch transistor SWns are controlled by a control signal CTss and a control signal CTns, respectively, from a control circuit (not shown) such as a CPU. In order to block leakage currents when the logic circuit block CB1 is in the stopped state, the threshold voltages of the switch transistors SWss and SWns are set higher than that of logic transistors included in the logic circuit cells LC1-1, LC1-2, and LC1-3.

The logic circuit block CB2 includes a logic circuit cell LC2-1, a logic circuit cell LC2-2, and a logic circuit cell LC2-3. The logic circuit cells LC2-1, LC2-2, and LC2-3 are connected between the supply voltage line VDL and the reference voltage line VSL. The logic circuit block CB2 is circuitry that should be constantly kept at the power-on state (be supplied with power) at least during the activation of the system (such circuitry encompasses also the above-described control circuit). Therefore, the logic circuit block CB2 is not provided with the virtual reference voltage line V-VSL, and the logic circuit cells LC2-1, LC2-2, and LC2-3 are connected directly to the reference voltage line VSL without the intermediary of the switch transistor SWss.

Figure 2A:
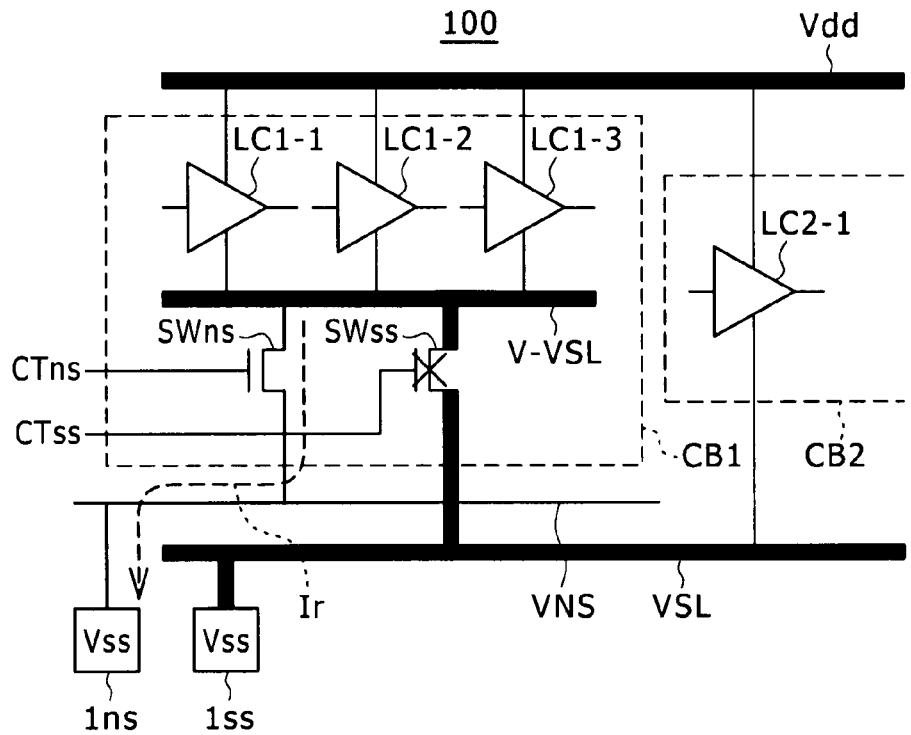
FIGS. 2A and 2B are diagrams showing a discharge path for an inrush current and a current path when the logic circuit block is in the operating state, respectively.

FIGS. 2 are diagrams showing the discharge path for an inrush current.

FIGS. 2 arise from partial cutting-out of FIG. 1, and the same symbol in FIGS. 1 and 2 indicates the same component.

When the logic circuit block CB1 is in the stopped state, leakage currents flow through the logic circuit cells LC1-1, LC1-2, and LC1-3. At this time, the switch transistors SWss and SWns are in the off-state, and therefore a long waiting time causes the potential of the virtual reference voltage line V-VSL to rise up close to the supply voltage Vdd.

When switching the state of the logic circuit block CB1 from the stopped state to the operating state (activating the logic circuit block CB1), the control circuit (not shown) turns on the switch transistor SWns by the control signal CTns and keeps the switch transistor SWss at the off-state. Therefore, as indicated by the dashed-line arrow in FIG. 2A, an inrush current Ir passes through the inrush-current discharge line VNS so as to flow from the power supply pad 1*ns* to the external system power supply or the like.

Figure 2B:
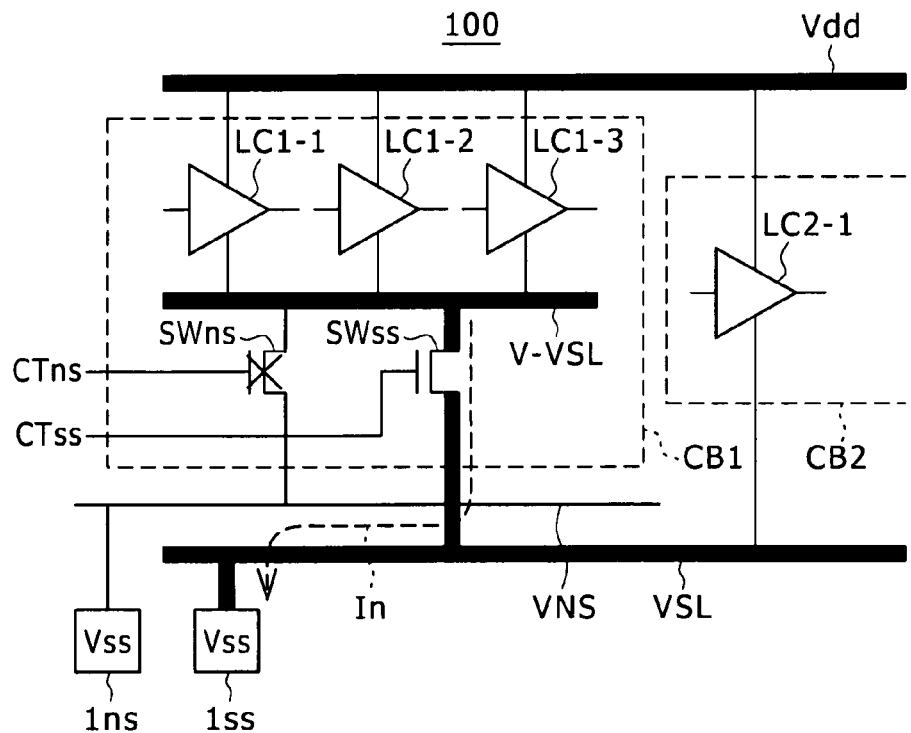

Subsequently, the control circuit checks whether or not the logic circuit block CB1 is actually switched to the operating state (activated). If the activation is confirmed, as shown in FIG. 2B, the control circuit turns off the switch transistor SWns to thereby isolate the virtual reference voltage line V-VSL from the inrush-current discharge line VNS.

As described later, the line width of the inrush-current discharge line VNS is smaller than that of the reference voltage line VSL in general. Therefore, even if the reference voltage Vss is applied from the inrush-current discharge line VNS as well as the reference voltage line VSL by keeping the switch transistor SWns at the on-state also after the switching of the logic circuit block CB1 to the stable operating state, the effect to stabilize the reference voltage Vss is small. Consequently, it is desirable that the switch transistor SWns be turned off after the switching of the logic circuit block CB1 to the stable operating state, in terms of prevention of a noise inflow from the external system power supply or the like via the power supply pad 1*ns* and prevention of the occurrence of electromigration due to the abrupt flowing of a large current through the small-width line.

Subsequently, the control circuit turns on the switch transistor SWss by the control signal CTss to thereby connect the virtual reference voltage line V-VSL to the reference voltage line VSL. Thus, as indicated by the dashed-line arrow in FIG. 2B, when the logic circuit block CB1 is in the operating state, a current In passes through the reference voltage line VSL so as to flow from the power supply pad 1*ss* to the external system power supply or the like.

In this manner, during the flowing of the inrush current Ir, the control circuit keeps the switch transistor SWss at the off-state to thereby isolate the virtual reference voltage line V-VSL from the reference voltage line VSL. In the state in which the logic circuit block CB1 is stabilized after the end of discharging of the charge accumulated in the virtual reference voltage line V-VSL, the control circuit turns on the switch transistor SWss to thereby connect the virtual reference voltage line V-VSL to the reference voltage line VSL. Therefore, the inrush current Ir causes no voltage change on the supply voltage line VDL and the reference voltage line VSL, and has no influence on the operation of the logic circuit block CB2. Because the inrush current Ir can be discharged in a short time, the logic circuit block CB1 can be stabilized rapidly, and thus the time it takes for the logic circuit block CB1 to be activated (returned) can be shortened.

Although FIGS. 1 and 2 show the example in which the logic circuit block CB1 includes three logic circuit cells, any number of logic circuit cells may be included therein. This also applies to the logic circuit block CB2. Furthermore, although FIGS. 1 and 2 show the example in which the logic circuit block CB1 includes one switch transistor SWss and one switch transistor SWns, plural switch transistors SWss and plural switch transistors SWns may be included therein.

The logic circuit block CB1 is an example of the stoppable circuit unit of the embodiment of the present invention. The reference voltage line VSL is an example of the first voltage line of the embodiment of the present invention. The inrush-current discharge line VNS is an example of the second voltage line of the embodiment of the present invention. The supply voltage line VDL is an example of the third voltage line of the embodiment of the present invention. The virtual reference voltage line V-VSL is an example of the internal voltage line of the embodiment of the present invention. The logic circuit cell LC1 is an example of the circuit cell of the embodiment of the present invention. The switch transistor SWns is an example of the first switch of the embodiment of the present invention. The switch transistor SWss is an example of the second switch of the embodiment of the present invention. The power supply pad 1*ss* is an example of the first power supply pad of the embodiment of the present invention. The power supply pad 1*ns* is an example of the second power supply pad of the embodiment of the present invention. The power supply pad 1*dd* is an example of the third power supply pad of the embodiment of the present invention. The logic circuit block CB2 is an example of the constantly-operating circuit unit of the embodiment of the present invention.

Figure 3:
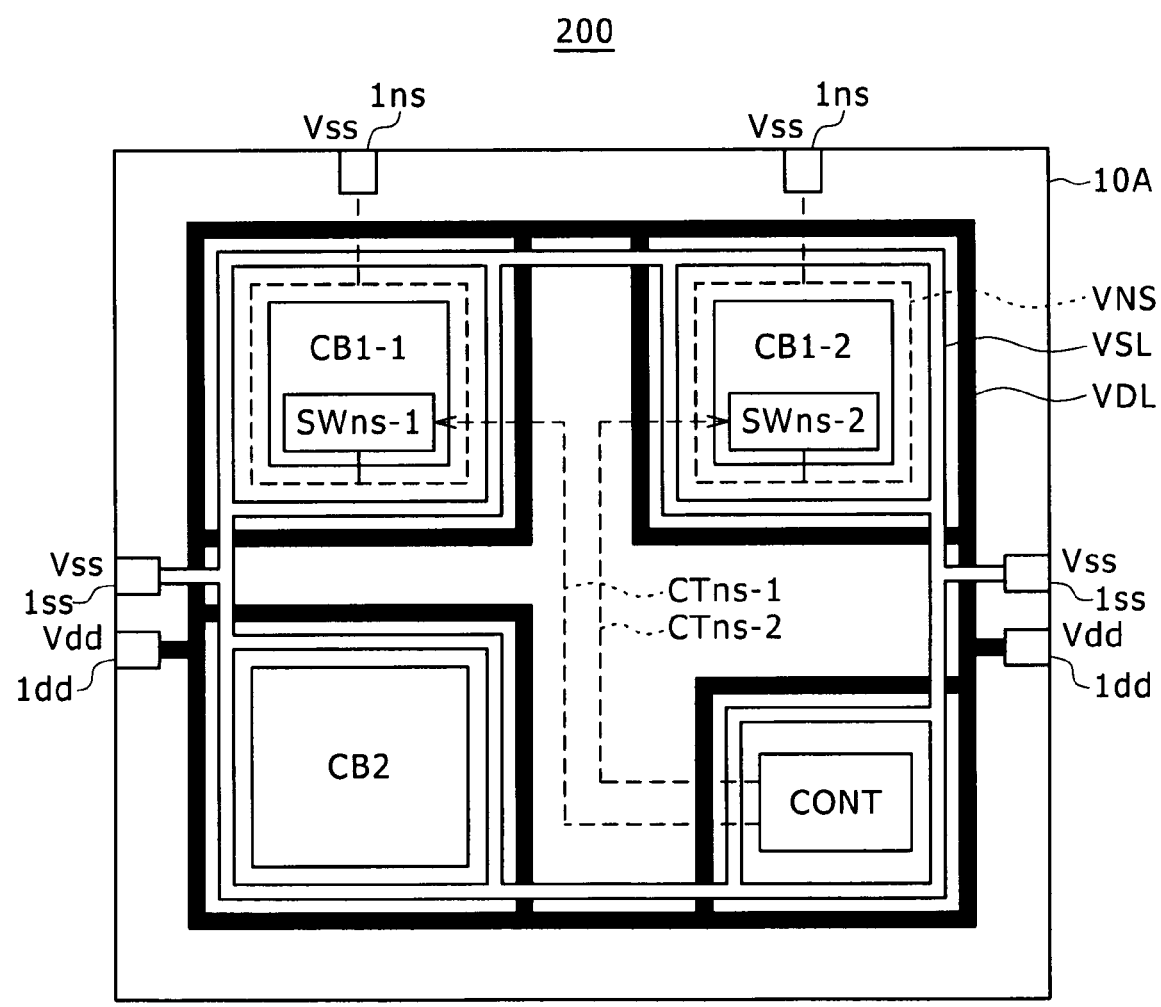
FIG. 3 is a diagram showing one example of a CMOS integrated circuit according to the first embodiment of the present invention.

FIG. 3 is a diagram showing one example of a CMOS integrated circuit according to the first of the embodiment of the present invention.

A CMOS integrated circuit 200 includes a logic circuit block CB1-1, a logic circuit block CB1-2, the logic circuit block CB2, a control circuit block CONT, the supply voltage line VDL, the reference voltage line VSL, the inrush-current discharge line VNS, the power supply pad 1dd, the power supply pad 1ss, and the power supply pad 1ns, which are all disposed over a semiconductor substrate 10A. The same symbol in FIGS. 1 and 3 indicates the same component.

The logic circuit blocks CB1-1 and CB1-2 are each a circuit block to which the MTCMOS technique is applied, and have the same configuration as that of the logic circuit block CB1 shown in FIG. 1. The logic circuit block CB2 and the control circuit block CONT are each a circuit block to which the MTCMOS technique is not applied.

Switch transistors SWns-1 and SWns-2 have the same configuration as that of the switch transistor SWns shown in FIG. 1. The gate voltages of these transistors are controlled by control signals CTns-1 and CTns-2 from the control circuit block CONT as shown in FIG. 3.

Switch transistors SWss (not shown) included in the logic circuit blocks CB1-1 and CB1-2 have the same configuration as that of the switch transistor SWss shown in FIG. 1, and are controlled by separate control signals CTss from the control circuit block CONT, each designed corresponding to a respective one of the logic circuit blocks CB1-1 and CB1-2. This allows the control circuit block CONT to control the operation stop and activation (return) of each of the logic circuit blocks CB1-1 and CB1-2 independently.

As shown in FIG. 3, in the periphery of the CMOS integrated circuit 200, plural power supply pads 1dd to which the high-level supply voltage Vdd is supplied, and plural power supply pads 1ss and plural power supply pads 1ns to which the low-level reference voltage Vss is supplied are disposed. Besides the power supply pads, signal input/output pads and so on are also disposed in the periphery of the CMOS integrated circuit 200, although the pads other than the power supply pads are not shown in FIG. 3.

The inrush-current discharge line VNS and the power supply pad 1ns are provided for each of the logic circuit blocks CB1-1 and CB1-2 separately, in order to ensure the paths for rapidly discharging the inrush current Ir.

The supply voltage line VDL connected to the power supply pads 1dd and the reference voltage line VSL connected to the power supply pads 1ss have an interconnect pattern that allows application of the common supply voltage Vdd and the common reference voltage Vss to the logic circuit block CB1-1, the logic circuit block CB1-2, the logic circuit block CB2, and the control circuit block CONT.

In the interconnect pattern shown in FIG. 3, the supply voltage line VDL and the reference voltage line VSL are so disposed as to surround each circuit block. In FIG. 3, the reference voltage line VSL is disposed close to the circuit blocks and the supply voltage line VDL is disposed outside the reference voltage line VSL. However, the converse line arrangement may be employed.

Although FIG. 3 shows the example including the logic circuit blocks CB1-1 and CB1-2 as the logic circuit block to which the MTCMOS technique is applied, any number of logic circuit blocks CB1 to which the MTCMOS technique is applied may be included. Similarly, any number of logic circuit blocks CB2 to which the MTCMOS technique is not applied may be included.

The control circuit block CONT is an example of the constantly-operating circuit unit and the controller of the embodiment of the present invention.

Figure 4:
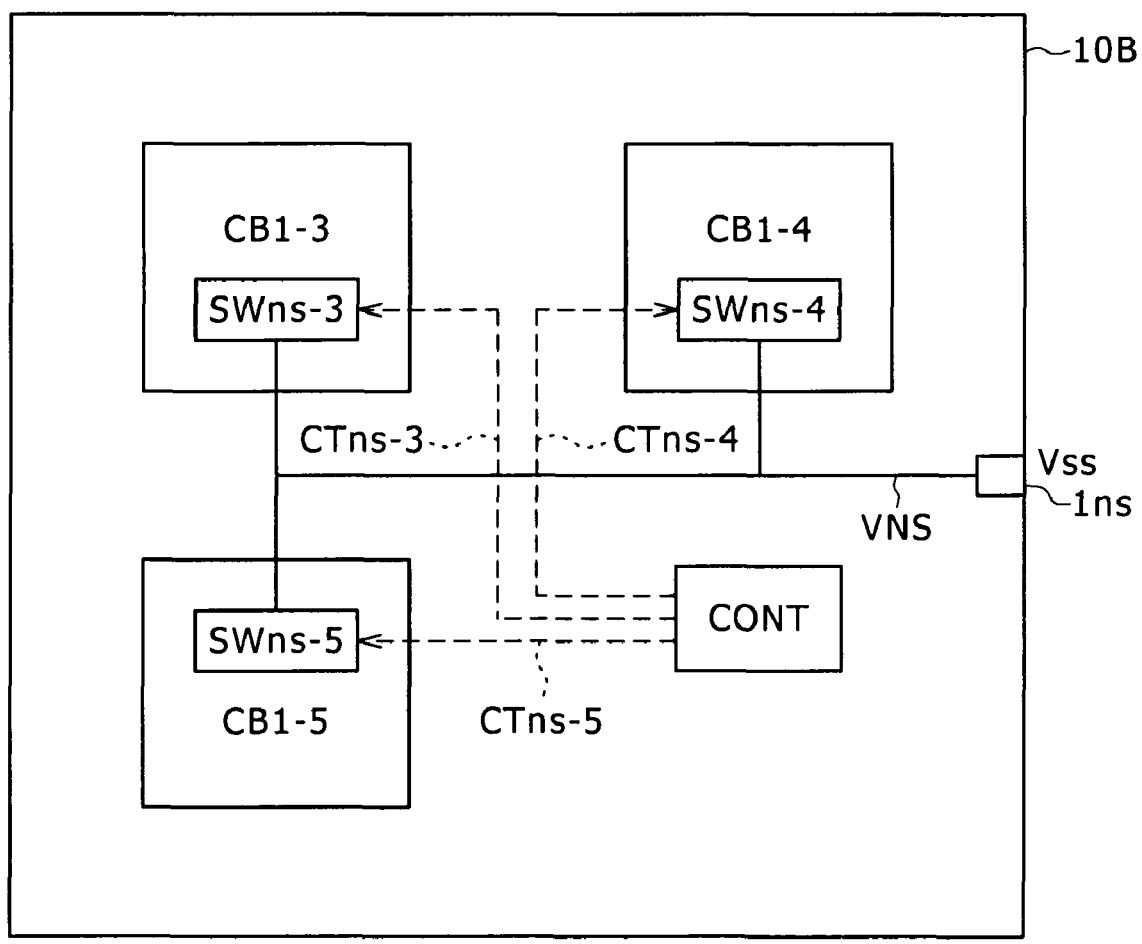
FIG. 4 is a diagram showing another example of the CMOS integrated circuit according to the first embodiment of the present invention.

FIG. 4 is a diagram showing another example of the CMOS integrated circuit according to the first of the embodiment of the present invention.

A CMOS integrated circuit 300 includes a logic circuit block CB1-3, a logic circuit block CB1-4, a logic circuit block CB1-5, the control circuit block CONT, the inrush-current discharge line VNS, and the power supply pad 1ns, which are all disposed over a semiconductor substrate 10B. The same symbol in FIGS. 3 and 4 indicates the same component. The CMOS integrated circuit 300 further includes the supply voltage line VDL, the reference voltage line VSL, the power supply pad 1dd, and the power supply pad 1ss having the same configurations as those of FIG. 3, although these components are not shown in FIG. 4.

In FIG. 3, the inrush-current discharge line VNS and the power supply pad 1ns are provided for each logic circuit block CB1 separately. In contrast, in FIG. 4, the inrush-current discharge line VNS and the power supply pad 1ns are shared by plural logic circuit blocks CB1.

The logic circuit blocks CB1-3, CB1-4, and CB1-5 are each a circuit block to which the MTCMOS technique is applied, and have the same configuration as that of the logic circuit block CB1 shown in FIG. 1.

Switch transistors SWns-3, SWns-4, and SWns-5 have the same configuration as that of the switch transistor SWns shown in FIG. 1. The gate voltages of these transistors are controlled by control signals CTns-3, CTns-4, and CTns-5 from the control circuit block CONT as shown in FIG. 4.

Switch transistors SWss (not shown) included in the logic circuit blocks CB1-3, CB1-4, and CB1-5 have the same configuration as that of the switch transistor SWss shown in FIG. 1, and are controlled by separate control signals CTss from the control circuit block CONT, each designed corresponding to a respective one of the logic circuit blocks CB1-3, CB1-4, and CB1-5. This allows the control circuit block CONT to control the operation stop and activation (return) of each of the logic circuit blocks CB1-3, CB1-4, and CB1-5 independently.

The inrush-current discharge line VNS connected to the power supply pad 1ns has an interconnect pattern that allows application of the common reference voltage Vss to the logic circuit blocks CB1-3, CB1-4, and CB1-5.

The control circuit block CONT switches (activates) the logic circuit blocks CB1 from the stopped state to the operating state one block by one block with time delays, to thereby prevent the inrush current Ir from being simultaneously discharged from the plural logic circuit blocks CB1.

The feature that the inrush-current discharge line VNS is shared by the plural logic circuit blocks CB1 can reduce the interconnect area and the number of power supply pads 1ns.

Although FIG. 4 shows the example including the logic circuit blocks CB1-3, CB1-4, and CB1-5 as the logic circuit block to which the MTCMOS technique is applied, any number of logic circuit blocks CB1 to which the MTCMOS technique is applied may be included. In addition, any number of logic circuit blocks CB2 to which the MTCMOS technique is not applied may be included.

Figure 5:
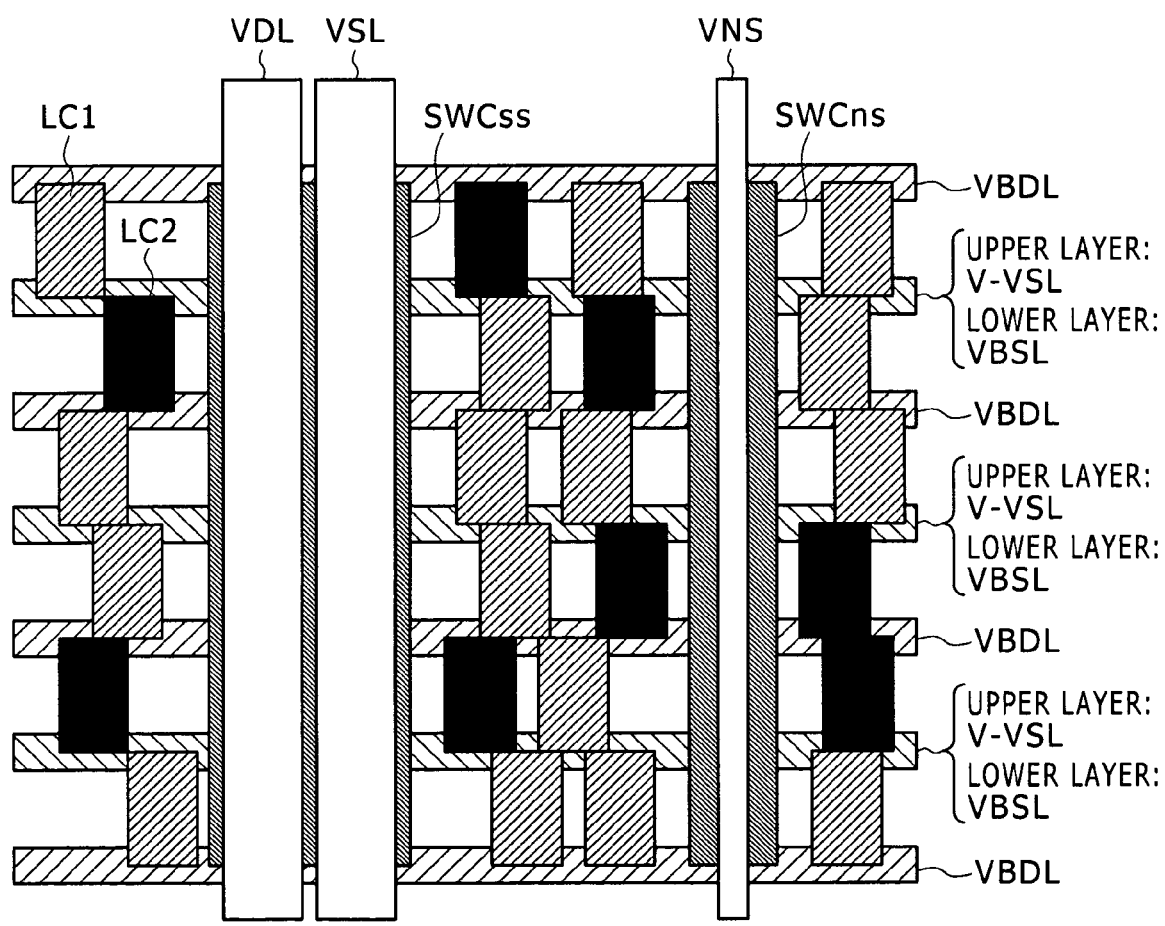
FIG. 5 is a diagram showing one example of the layout of the logic circuit block according to the first embodiment of the present invention.

FIG. 5 is a diagram showing one example of the layout of the logic circuit block according to the first embodiment of the present invention.

In the example of FIG. 5, the supply voltage line VDL and the reference voltage line VSL are disposed adjacent to each other, and the inrush-current discharge line VNS is disposed in parallel to these lines.

A current flows through the inrush-current discharge line VNS just during the transient state of the switching (activation) of the logic circuit block CB1 from the stopped state to the operating state. Therefore, the line width of the inrush-current discharge line VNS may be smaller than that of the reference voltage line VSL.

Decreasing the line width of the inrush-current discharge line VNS increases the resistance thereof, and thus can reduce the peak value of the inrush current. A current flows through the reference voltage line VSL when the logic circuit block CB1 is in the operating state. Therefore, the small line width of the inrush-current discharge line VNS has no influence on the operation of the logic circuit block CB1.

Supply voltage branch lines VBDL, reference voltage branch lines VBSL, and the virtual reference voltage lines V-VSL diverge from the supply voltage line VDL and the reference voltage line VSL disposed adjacent to each other. All of these branch lines extend along the direction perpendicular to the supply voltage line VDL and the reference voltage line VSL.

The reference voltage branch line VBSL and the virtual reference voltage line V-VSL are formed of different interconnect layers and face each other. The reference voltage branch line VBSL is disposed under the virtual reference voltage line V-VSL.

The supply voltage line VDL is connected to the supply voltage branch line VBDL via a contact interconnect that penetrates the interconnect layer of the supply voltage line VDL and the interconnect layer of the supply voltage branch line VBDL under the supply voltage line VDL. Similarly, the reference voltage line VSL is connected to the reference voltage branch line VBSL via a contact interconnect that penetrates the interconnect layer of the reference voltage line VSL and the interconnect layer of the reference voltage branch line VBSL under the reference voltage line VSL.

The virtual reference voltage line V-VSL is connected to the reference voltage line VSL when the switch transistor SWss included in a switch cell SWCss is in the on-state as described later. Furthermore, the virtual reference voltage line V-VSL is connected to the inrush-current discharge line VNS when the switch transistor SWns included in a switch cell SWCns is in the on-state as described later.

At least a part of the switch cell SWCss is included in a region under the supply voltage line VDL and the reference voltage line VSL. At least a part of the switch cell SWCns is included in a region under the inrush-current discharge line VNS.

The logic circuit cell LC1 is connected to the supply voltage branch line VBDL and the virtual reference voltage line V-VSL as described later. On the other hand, the logic circuit cell LC2 is connected to the supply voltage branch line VBDL and the reference voltage branch line VBSL as described later.

Figure 6:
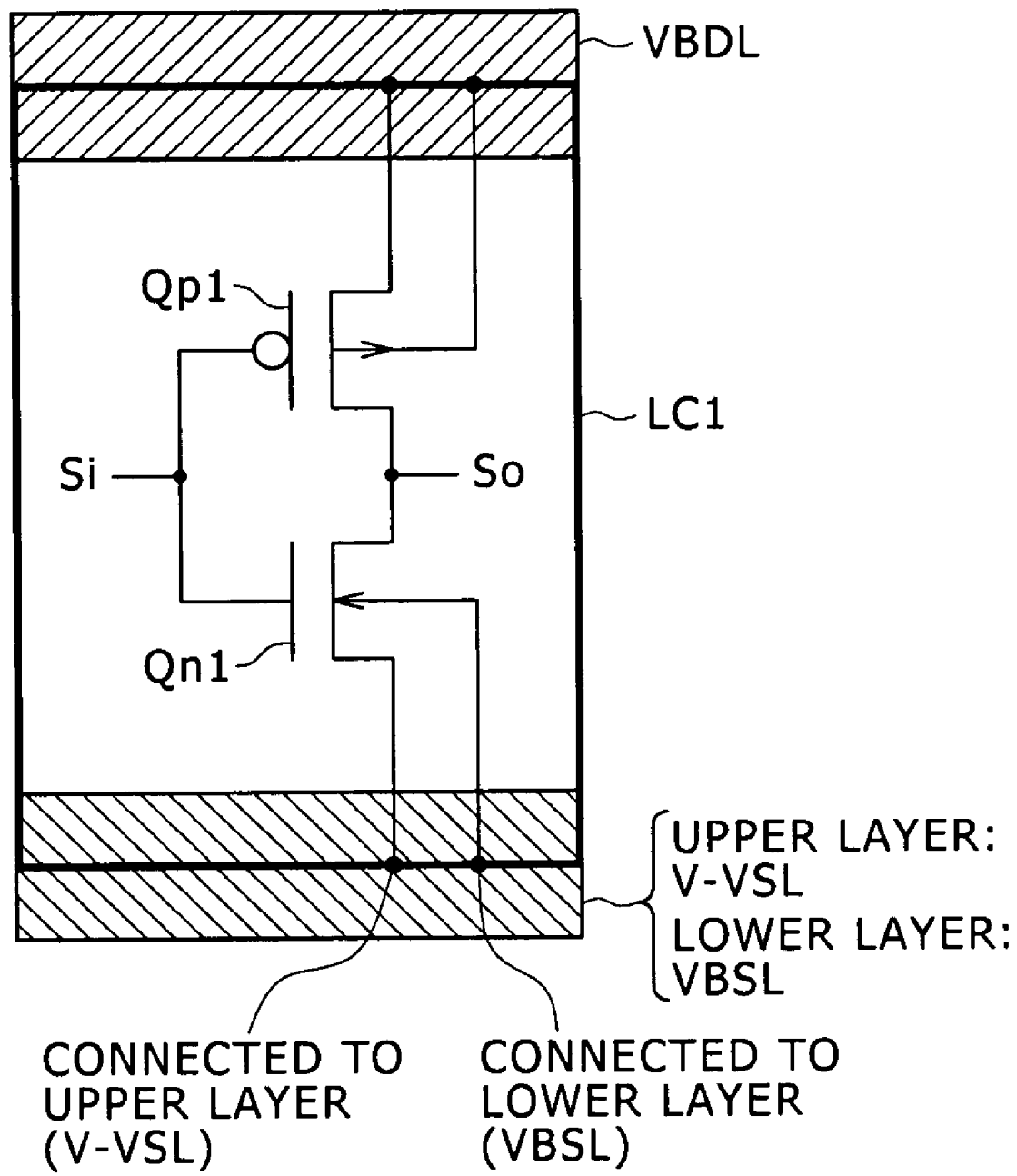
FIG. 6 is a diagram showing one example of the configuration of a logic circuit cell to which an MTCMOS technique is applied according to the first embodiment of the present invention.

FIG. 6 is a diagram showing one example of the configuration of the logic circuit cell to which the MTCMOS technique is applied according to the first embodiment of the present invention.

The logic circuit cell LC1 includes an inverter circuit, the supply voltage branch line VBDL, the reference voltage branch line VBSL, and the virtual reference voltage line V-VSL. The inverter circuit is formed of a series circuit of a p-type MOS transistor Qp1 and an n-type MOS transistor Qn1. The inverter circuit is connected to the supply voltage branch line VBDL, the reference voltage branch line VBSL, and the virtual reference voltage line V-VSL.

Although FIG. 6 shows an inverter circuit cell as one example, the logic circuit cell LC1 according to the present embodiment encompasses also other various kinds of circuit cells, such as a NAND circuit cell, used as the basic circuit.

The inverter circuit (Qp1, Qn1) is connected between the virtual reference voltage line V-VSL and the supply voltage branch line VBDL, and receives power supply from these lines. Therefore, when both the switch transistor SWss included in the switch cell SWCss and the switch transistor SWns included in the switch cell SWCns are in the off-state, the power supply to the inverter circuit is stopped.

In the example of FIG. 6, the substrate of the p-type MOS transistor Qp1 is connected to the supply voltage branch line VBDL, and the substrate of the n-type MOS transistor Qn1 is connected to the reference voltage branch line VBSL. Because the supply voltage branch line VBDL and the reference voltage branch line VBSL are constantly connected to the supply voltage line VDL and the reference voltage line VSL, the substrate potentials of these MOS transistors can be stably kept irrespective of whether or not the power supply thereto is blocked.

Figure 7:
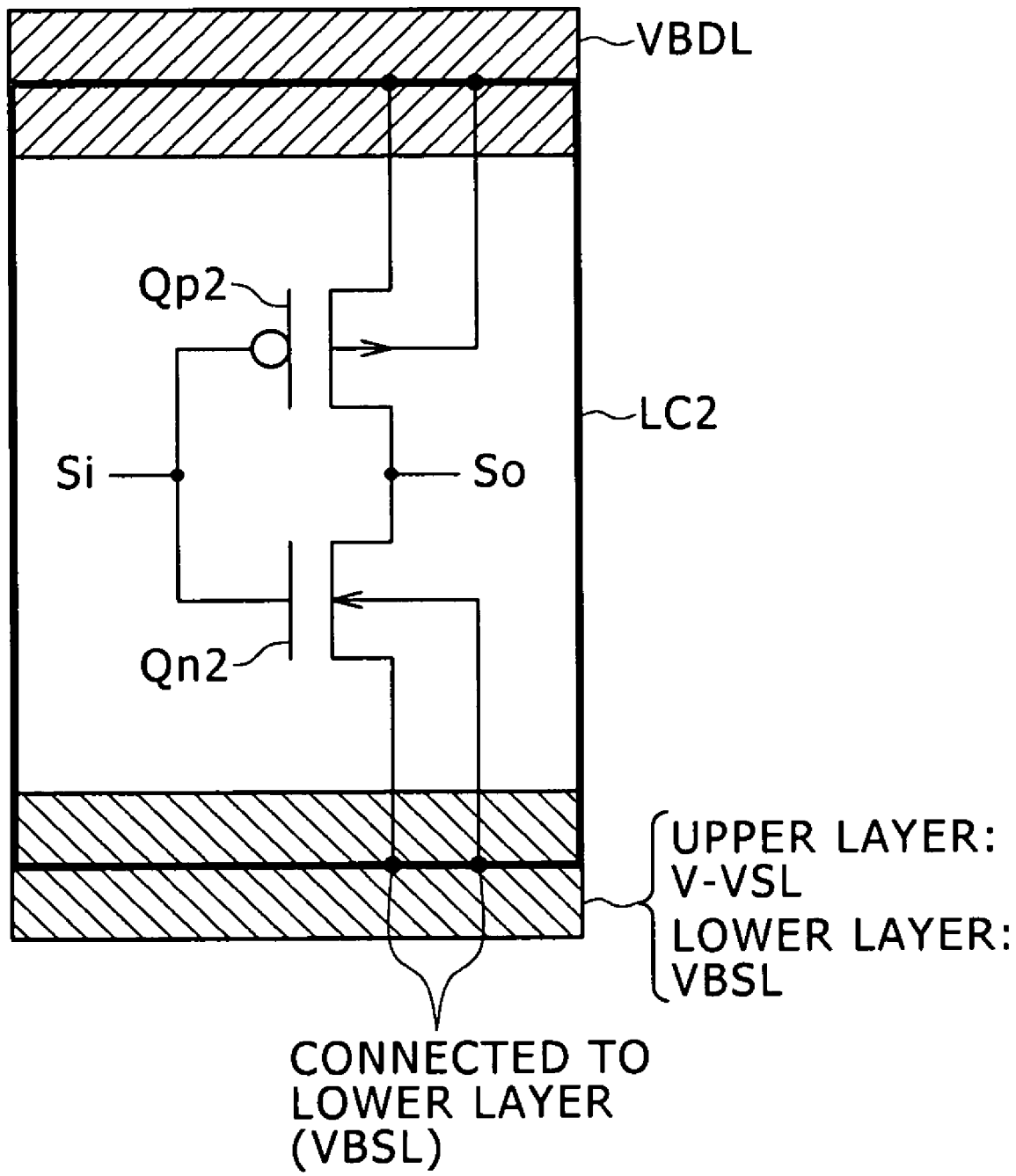
FIG. 7 is a diagram showing one example of the configuration of a logic circuit cell to which the MTCMOS technique is not applied.

FIG. 7 is a diagram showing one example of the configuration of the logic circuit cell to which the MTCMOS technique is not applied.

The logic circuit cell LC2 includes an inverter circuit, the supply voltage branch line VBDL, the reference voltage branch line VBSL, and the virtual reference voltage line V-VSL. The inverter circuit is formed of a series circuit of a p-type MOS transistor Qp2 and an n-type MOS transistor Qn2. The inverter circuit is connected to the supply voltage branch line VBDL and the reference voltage branch line VBSL.

Although FIG. 7 shows an inverter circuit cell as one example, the logic circuit cell LC2 encompasses also other various kinds of circuit cells, such as a NAND circuit cell, used as the basic circuit.

The interconnect for supplying power to the inverter circuit is different between the logic circuit cell LC1 and the logic circuit cell LC2. Specifically, the logic circuit cell LC1 receives power supply from the virtual reference voltage line V-VSL and the supply voltage branch line VBDL, and therefore the power supply to the logic circuit cell LC1 is blocked when both the switch transistor SWss included in the switch cell SWCss and the switch transistor SWns included in the switch cell SWCns are in the off-state. In contrast, the logic circuit cell LC2 receives power supply from the supply voltage branch line VBDL and the reference voltage branch line VBSL, and therefore power is constantly supplied to the logic circuit cell LC2.

Figure 8:
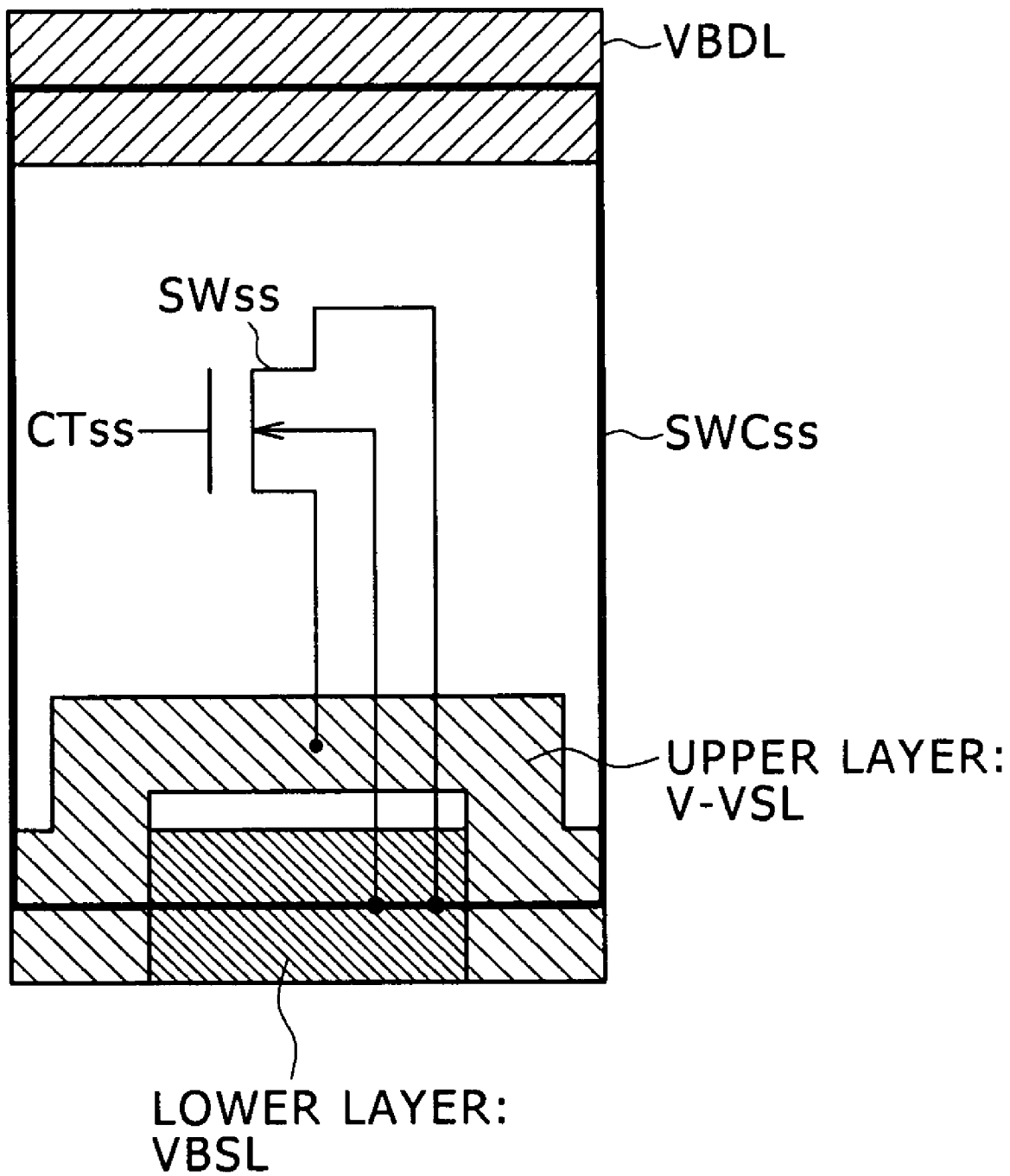
FIG. 8 is a diagram showing one example of the configuration of a switch cell for interconnecting a reference voltage line VSL and a virtual reference voltage line V-VSL.

FIG. 8 is a diagram showing one example of the configuration of the switch cell for interconnecting the reference voltage line VSL and the virtual reference voltage line V-VSL.

The switch cell SWCss includes the n-type MOS transistor SWss, the supply voltage branch line VBDL, the reference voltage branch line VBSL, and the virtual reference voltage line V-VSL. The n-type MOS transistor SWss is connected to the reference voltage branch line VBSL and the virtual reference voltage line V-VSL.

The virtual reference voltage line V-VSL is formed of the interconnect layer above the reference voltage branch line VBSL and is so formed as to face the reference voltage branch line VBSL. The center part of the virtual reference voltage line V-VSL is recessed in a U-character shape toward the inside of the switch cell SWCss. In the area arising from the recessing, the contact interconnect for interconnecting the reference voltage branch line VBSL and the reference voltage line VSL is disposed.

The drain of the n-type MOS transistor SWss is connected to the virtual reference voltage line V-VSL, and the source and substrate thereof are connected to the reference voltage branch line VBSL. The control signal CTss is input to the gate, and the n-type MOS transistor SWss is turned on or off in accordance with the signal level thereof.

When the n-type MOS transistor SWss is turned on, the reference voltage branch line VBSL is connected to the virtual reference voltage line V-VSL, so that power is supplied to the logic circuit cell LC1. When the n-type MOS transistor SWss is turned off, the reference voltage branch line VBSL is isolated from the virtual reference voltage line V-VSL, so that the power supply to the logic circuit cell LC1 is blocked.

Figure 9:
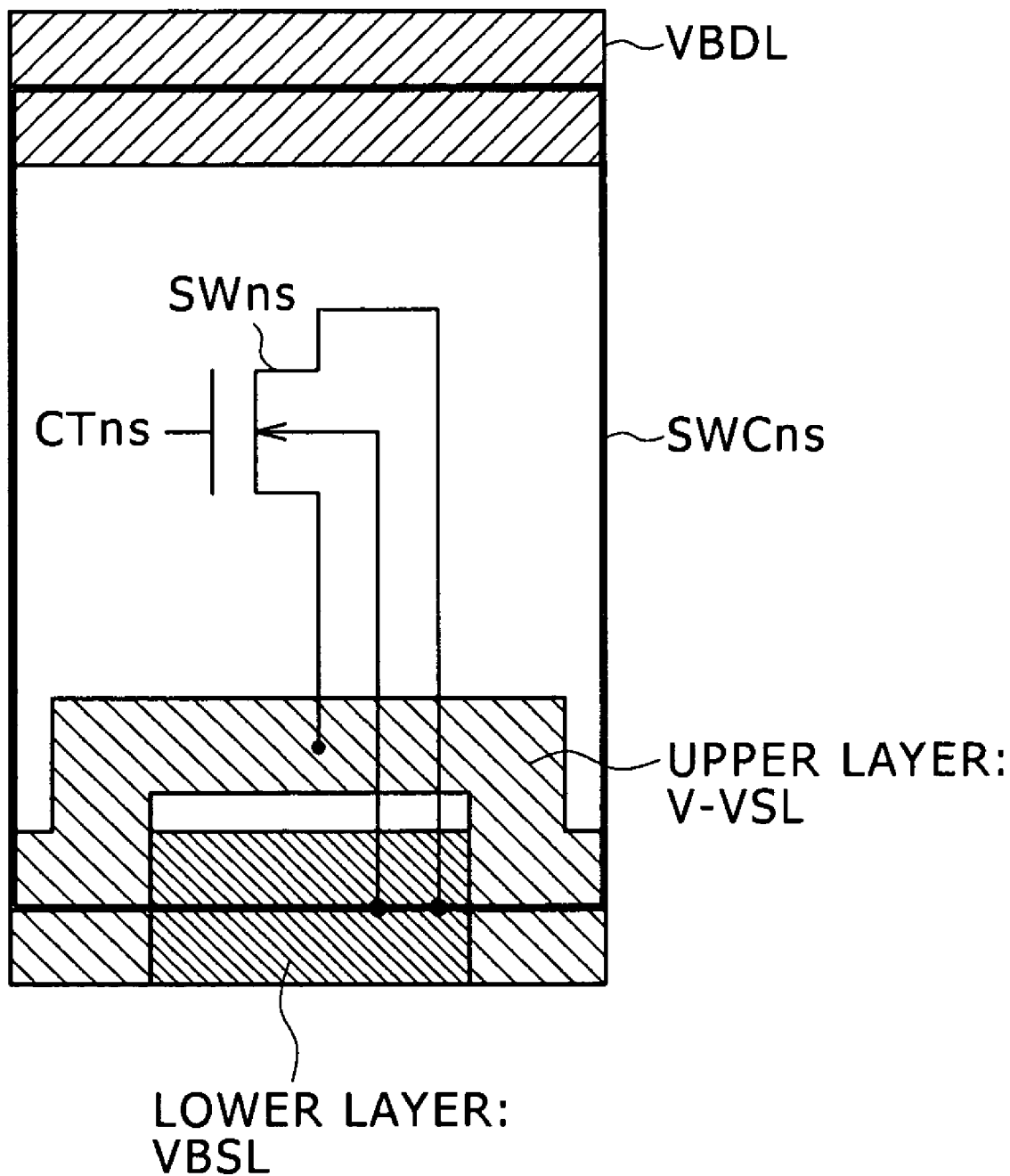
FIG. 9 is a diagram showing one example of the configuration of a switch cell for interconnecting an inrush-current discharge line VNS and the virtual reference voltage line V-VSL.

FIG. 9 is a diagram showing one example of the configuration of the switch cell for interconnecting the inrush-current discharge line VNS and the virtual reference voltage line V-VSL.

The switch cell SWCns includes the n-type MOS transistor SWns, the supply voltage branch line VBDL, the reference voltage branch line VBSL, and the virtual reference voltage line V-VSL. The n-type MOS transistor SWns is connected to the reference voltage branch line VBSL and the virtual reference voltage line V-VSL.

The configuration of the switch cell SWCns is similar to that of the switch cell SWCss shown in FIG. 8. However, this switch cell SWCns is different from the switch cell SWCss in that the control signal CTns is input to the gate of the n-type MOS transistor SWns, and in that a contact interconnect for connecting the reference voltage branch line VBSL to the inrush-current discharge line VNS is disposed in the area arising from the recessing of the center part of the virtual reference voltage line V-VSL.

A current flows through the inrush-current discharge line VNS just during the transient state of the switching (activation) of the logic circuit block CB1 from the stopped state to the operating state. Therefore, the channel width of the n-type MOS transistor SWns may be smaller than that of the n-type MOS transistor SWss.

Decreasing the channel width of the n-type MOS transistor SWns increases the resistance of the channel, and thus can reduce the peak value of the inrush current. A current flows through the n-type MOS transistor SWss when the logic circuit block CB1 is in the operating state. Therefore, the small channel width of the n-type MOS transistor SWns has no influence on the operation of the logic circuit block CB1.

The n-type MOS transistor Qn1 is an example of the first field effect transistor of the embodiment of the present invention. The n-type MOS transistor SWns is an example of the second field effect transistor of the embodiment of the present invention. The n-type MOS transistor SWss is an example of the third field effect transistor of the embodiment of the present invention.

Figure 10:
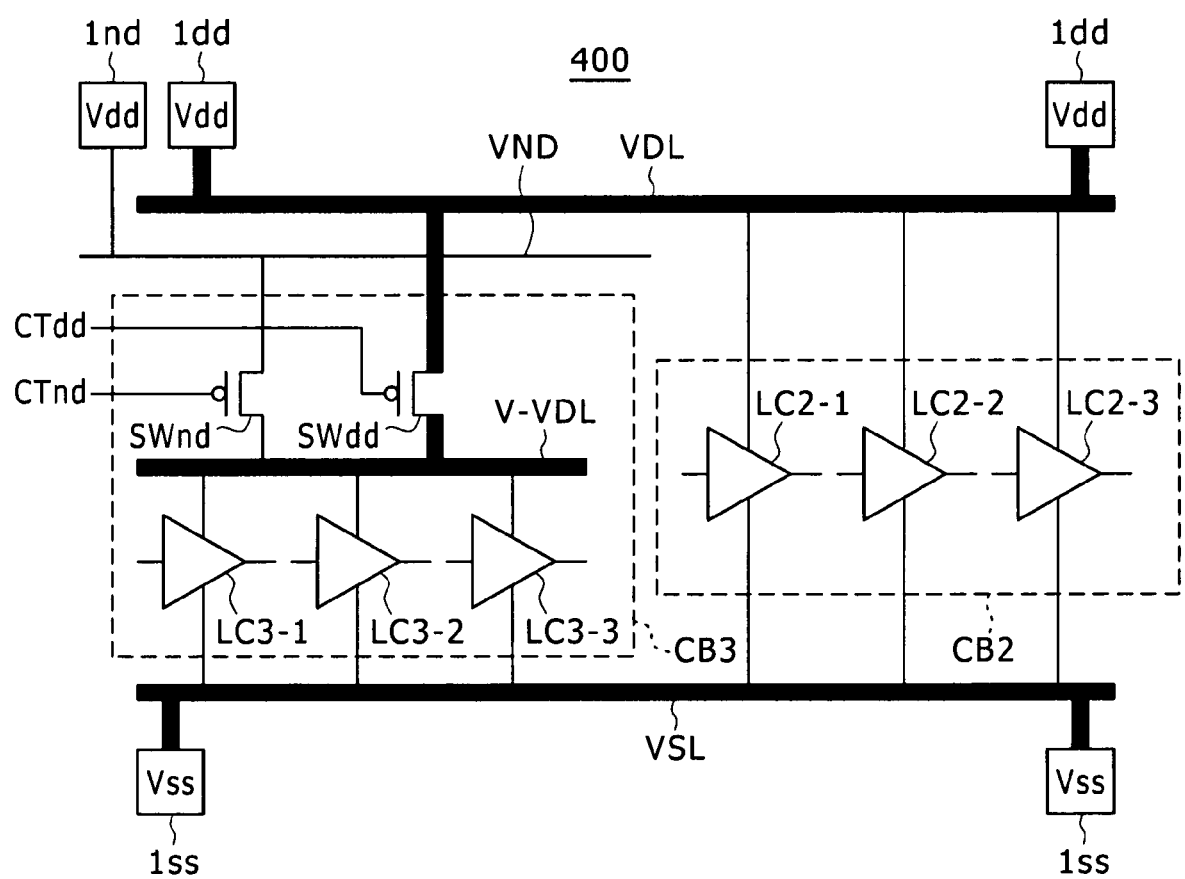
FIG. 10 is a diagram showing one example of a logic circuit block according to a second embodiment of the present invention.

FIG. 10 is a diagram showing one example of a logic circuit block according to a second embodiment of the present invention.

A CMOS integrated circuit 400 includes the logic circuit block CB2, a logic circuit block CB3, the supply voltage line VDL, an inrush-current inflow line VND, the reference voltage line VSL, a power supply pad 1nd, the power supply pad 1dd, and the power supply pad 1ss. The same symbol in FIGS. 1 and 10 indicates the same component. In FIG. 1, an inrush current is discharged by the inrush-current discharge line VNS. In contrast, in FIG. 10, an inrush current is caused to flow in the logic circuit block CB3 by the inrush-current inflow line VND.

The logic circuit block CB3 is a circuit block to which an MTCMOS technique is applied.

The logic circuit block CB3 is different from the logic circuit block CB1 in that it is not connected to the inrush-current discharge line VNS but connected to the inrush-current inflow line VND. The inrush-current inflow line VND is connected to the power supply pad 1nd, and the power supply pad 1nd receives power from a system power supply or the like provided on a mounting substrate when the CMOS integrated circuit 400 is mounted thereon. At this time, the high-level supply voltage Vdd is applied to the power supply pad 1nd.

The logic circuit block CB3 includes a logic circuit cell LC3-1, a logic circuit cell LC3-2, a logic circuit cell LC3-3, a switch transistor SWnd, a switch transistor SWdd, and a virtual supply voltage line V-VDL.

The logic circuit cells LC3-1, LC3-2, and LC3-3 are connected between the virtual supply voltage line V-VDL and the reference voltage line VSL. Each of the logic circuit cells LC3-1, LC3-2, and LC3-3 includes a p-type MOS transistor and an n-type MOS transistor similarly to the logic circuit cell LC1 shown in FIG. 6.

The switch transistor SWdd controls the connection and disconnection between the supply voltage line VDL and the virtual supply voltage line V-VDL. Similarly, the switch transistor SWnd controls the connection and disconnection between the inrush-current inflow line VND and the virtual supply voltage line V-VDL. The switch transistors SWdd and SWnd are controlled by a control signal CTdd and a control signal CTnd, respectively, from a control circuit (not shown) such as a CPU.

The switch transistors SWdd and SWnd are each a p-type MOS transistor. In order to block leakage currents when the logic circuit block CB3 is in the stopped state, the threshold voltages of the switch transistors SWdd and SWnd are set higher than that of the p-type MOS transistors included in the logic circuit cells LC3-1, LC3-2, and LC3-3.

When the logic circuit block CB3 is in the stopped state, leakage currents flow through the logic circuit cells LC3-1, LC3-2, and LC3-3. At this time, the switch transistors SWdd and SWnd are in the off-state, and therefore a long waiting time causes the potential of the virtual supply voltage line V-VDL to fall down close to the reference voltage Vss.

When switching the state of the logic circuit block CB3 from the stopped state to the operating state (activating the logic circuit block CB3), the control circuit (not shown) turns on the switch transistor SWnd by the control signal CTnd and keeps the switch transistor SWdd at the off-state. Thus, an inrush current flows.

Subsequently, the control circuit checks whether or not the logic circuit block CB3 is actually switched to the operating state (activated). If the activation is confirmed, the control circuit turns off the switch transistor SWnd to thereby isolate the inrush-current inflow line VND from the virtual supply voltage line V-VDL.

As described later, the line width of the inrush-current inflow line VND is smaller than that of the supply voltage line VDL in general. Consequently, it is desirable that the switch transistor SWnd be turned off after the switching of the logic circuit block CB3 to the stable operating state, in terms of prevention of a noise inflow from the external system power supply or the like via the power supply pad 1nd and prevention of the occurrence of electromigration due to the abrupt flowing of a large current through the small-width line.

Thereafter, the control circuit turns on the switch transistor SWdd by the control signal CTdd to thereby connect the virtual supply voltage line V-VDL to the supply voltage line VDL.

In this manner, during the flowing of the inrush current, the control circuit keeps the switch transistor SWdd at the off-state to thereby isolate the supply voltage line VDL from the virtual supply voltage line V-VDL. In the state in which the logic circuit block CB3 is stabilized after the end of the inflow of the inrush current, the control circuit turns on the switch transistor SWdd to thereby connect the supply voltage line VDL to the virtual supply voltage line V-VDL. Therefore, the inrush current causes no voltage change on the supply voltage line VDL and the reference voltage line VSL, and has no influence on the operation of the logic circuit block CB2. Because the inflow of the inrush current can be completed in a short time, the logic circuit block CB3 can be stabilized rapidly, and thus the time it takes for the logic circuit block CB3 to be activated (returned) can be shortened.

A current flows through the inrush-current inflow line VND just during the transient state of the switching (activation) of the logic circuit block CB3 from the stopped state to the operating state. Therefore, the line width of the inrush-current inflow line VND may be smaller than that of the supply voltage line VDL. Furthermore, the channel width of the p-type MOS transistor SWnd may be smaller than that of the p-type MOS transistor SWdd.

Although FIG. 10 shows the example in which the logic circuit block CB3 includes three logic circuit cells, any number of logic circuit cells may be included therein. This also applies to the logic circuit block CB2. Furthermore, although FIG. 10 shows the example in which the logic circuit block CB3 includes one switch transistor SWdd and one switch transistor SWnd, plural switch transistors SWdd and plural switch transistors SWnd may be included therein.

Also in the second embodiment, similarly to the first embodiment, any number of logic circuit blocks CB3 to which the MTCMOS technique is applied may be provided on the same semiconductor substrate. In addition, any number of logic circuit blocks CB2 to which the MTCMOS technique is not applied may be provided thereon.

The inrush-current inflow line VND and the power supply pad 1nd may be provided for each of the individual logic circuit blocks CB3 separately. Alternatively, they may be shared by plural logic circuit blocks CB3.

The logic circuit block CB3 is an example of the stoppable circuit unit of the embodiment of the present invention. The supply voltage line VDL is an example of the first voltage line of the embodiment of the present invention. The inrush-current inflow line VND is an example of the second voltage line of the embodiment of the present invention. The reference voltage line VSL is an example of the third voltage line of the embodiment of the present invention. The virtual supply voltage line V-VDL is an example of the internal voltage line of the embodiment of the present invention. The logic circuit cell LC3 is an example of the circuit cell of the embodiment of the present invention. The switch transistor SWnd is an example of the first switch of the embodiment of the present invention. The switch transistor SWdd is an example of the second switch of the embodiment of the present invention. The power supply pad 1dd is an example of the first power supply pad of the embodiment of the present invention. The power supply pad 1nd is an example of the second power supply pad of the embodiment of the present invention. The power supply pad 1ss is an example of the third power supply pad of the embodiment of the present invention. The logic circuit block CB2 is an example of the constantly-operating circuit unit of the embodiment of the present invention. The p-type MOS transistor included in the logic circuit cell LC3 is an example of the first field effect transistor of the embodiment of the present invention. The p-type MOS transistor SWnd is an example of the second field effect transistor of the embodiment of the present invention. The p-type MOS transistor SWdd is an example of the third field effect transistor of the embodiment of the present invention.

Figure 11:
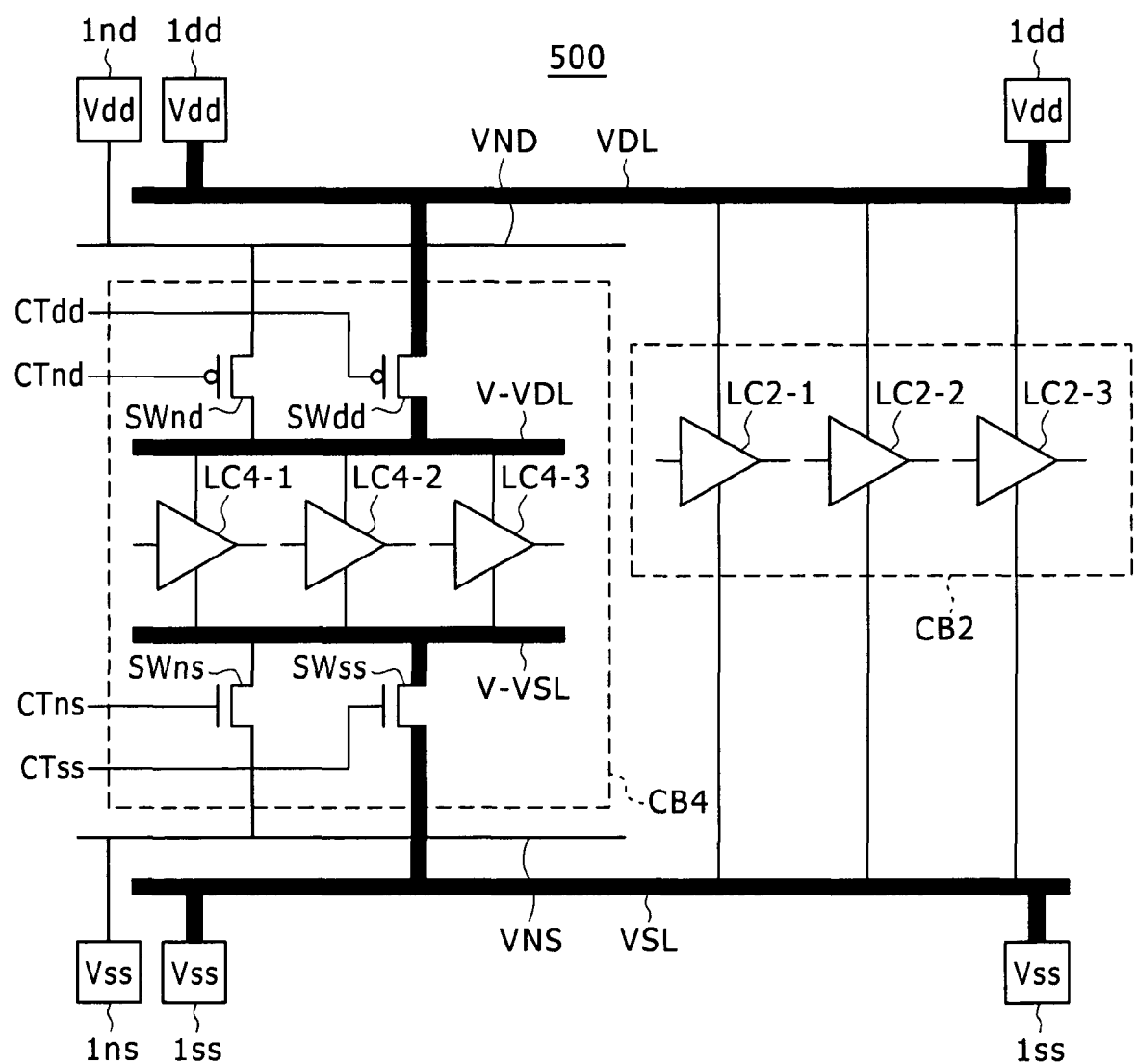
FIG. 11 is a diagram showing one example of a logic circuit block according to a third embodiment of the present invention.

FIG. 11 is a diagram showing one example of a logic circuit block according to a third embodiment of the present invention.

A CMOS integrated circuit 500 includes the logic circuit block CB2, a logic circuit block CB4, the supply voltage line VDL, the inrush-current inflow line VND, the reference voltage line VSL, the inrush-current discharge line VNS, the power supply pad 1dd, the power supply pad 1nd, the power supply pad 1ss, and the power supply pad 1ns. The same symbol in FIGS. 1 and 11 indicates the same component. In FIG. 1, an inrush current is discharged by the inrush-current discharge line VNS alone. In contrast, in FIG. 11, an inrush current is caused to flow in the logic circuit block CB4 by the inrush-current inflow line VND and an inrush current is discharged by the inrush-current discharge line VNS.

The logic circuit block CB4 is a circuit block to which an MTCMOS technique is applied.

The logic circuit block CB4 is different from the logic circuit block CB1 in that it is connected to the inrush-current inflow line VND. The inrush-current inflow line VND is connected to the power supply pad 1nd, and the power supply pad 1nd receives power from a system power supply or the like provided on a mounting substrate when the CMOS integrated circuit 500 is mounted thereon. At this time, the high-level supply voltage Vdd is applied to the power supply pad 1nd.

In addition to the same components as those in the logic circuit block CB1, the logic circuit block CB4 includes the virtual supply voltage line V-VDL, the switch transistor SWnd, and the switch transistor SWdd.

Logic circuit cells LC4-1, LC4-2, and LC4-3 are connected between the virtual supply voltage line V-VDL and the virtual reference voltage line V-VSL. Each of the logic circuit cells LC4-1, LC4-2, and LC4-3 includes a p-type MOS transistor and an n-type MOS transistor similarly to the logic circuit cell LC1 shown in FIG. 6.

The switch transistor SWdd controls the connection and disconnection between the virtual supply voltage line V-VDL and the supply voltage line VDL. Similarly, the switch transistor SWnd controls the connection and disconnection between the virtual supply voltage line V-VDL and the inrush-current inflow line VND. The switch transistors SWdd and SWnd are controlled by the control signals CTdd and CTnd, respectively, from a control circuit (not shown) such as a CPU.

The switch transistors SWdd and SWnd are each a p-type MOS transistor. In order to block leakage currents when the logic circuit block CB4 is in the stopped state, the threshold voltages of the switch transistors SWdd and SWnd are set higher than that of the p-type MOS transistors included in the logic circuit cells LC4-1, LC4-2, and LC4-3.

The switch transistors SWss and SWns are each an n-type MOS transistor. In order to block leakage currents when the logic circuit block CB4 is in the stopped state, the threshold voltages of the switch transistors SWss and SWns are set higher than that of the n-type MOS transistors included in the logic circuit cells LC4-1, LC4-2, and LC4-3.

When the logic circuit block CB4 is in the stopped state, leakage currents flow through the logic circuit cells LC4-1, LC4-2, and LC4-3. At this time, the switch transistors SWdd, SWnd, SWss, and SWns are in the off-state. Thus, a long waiting time causes the potentials of the virtual supply voltage line V-VDL and the virtual reference voltage line V-VSL to become approximately equal to each other. These resulting potentials are intermediate ones between the supply voltage Vdd and the reference voltage Vss.

When switching the state of the logic circuit block CB4 from the stopped state to the operating state (activating the logic circuit block CB4), the control circuit (not shown) turns on the switch transistors SWnd and SWns by the control signals CTnd and CTns and keeps the switch transistors SWdd and SWss at the off-state. Thus, inrush currents flow.

Subsequently, the control circuit checks whether or not the logic circuit block CB4 is actually switched to the operating state (activated). If the activation is confirmed, the control circuit turns off the switch transistor SWnd to thereby isolate the virtual supply voltage line V-VDL from the inrush-current inflow line VND, and turns off the switch transistor SWns to thereby isolate the virtual reference voltage line V-VSL from the inrush-current discharge line VNS.

As described later, the line width of the inrush-current inflow line VND and the inrush-current discharge line VNS is small in general. Consequently, it is desirable that the switch transistors SWnd and SWns be turned off after the switching of the logic circuit block CB4 to the stable operating state, in terms of prevention of a noise inflow from the external system power supply or the like via the power supply pads 1nd and 1ns and prevention of the occurrence of electromigration due to the abrupt flowing of a large current through the small-width lines.

Thereafter, the control circuit turns on the switch transistor Swdd by the control signal CTdd to thereby connect the virtual supply voltage line V-VDL to the supply voltage line VDL. Furthermore, the control circuit turns on the switch transistor SWss by the control signal CTss to thereby connect the virtual reference voltage line V-VSL to the reference voltage line VSL.

In the case of the logic circuit block CB1 shown in FIG. 1, the voltage of the supply voltage line VDL changes if the charge accumulated during the stopped state is suddenly discharged at the time of activation. On the other hand, the logic circuit block CB4 is isolated from the supply voltage line VDL and the reference voltage line VSL at the time of activation. Therefore, neither the reference voltage line VSL nor the supply voltage line VDL is affected by an inrush current. The logic circuit block CB4 can discharge the inrush current more rapidly than the logic circuit block CB1, and thus can achieve a shortened activation (return) time.

A current flows through the inrush-current inflow line VND just during the transient state of the switching (activation) of the logic circuit block CB4 from the stopped state to the operating state. Therefore, the line width of the inrush-current inflow line VND may be smaller than that of the supply voltage line VDL. Furthermore, the channel width of the p-type MOS transistor SWnd may be smaller than that of the p-type MOS transistor SWdd.

Similarly, a current flows through the inrush-current discharge line VNS just during the transient state of the switching (activation) of the logic circuit block CB4 from the stopped state to the operating state. Therefore, the line width of the inrush-current discharge line VNS may be smaller than that of the reference voltage line VSL. Furthermore, the channel width of the n-type MOS transistor SWns may be smaller than that of the n-type MOS transistor SWss.

Also in the third embodiment, similarly to the first embodiment, any number of logic circuit blocks CB4 to which the MTCMOS technique is applied may be provided on the same semiconductor substrate. In addition, any number of logic circuit blocks CB2 to which the MTCMOS technique is not applied may be provided thereon.

The inrush-current inflow line VND and the power supply pad 1nd may be provided for each of the individual logic circuit blocks CB4 separately. Alternatively, they may be shared by plural logic circuit blocks CB4. Similarly, the inrush-current discharge line VNS and the power supply pad 1ns may be provided for each of the individual logic circuit blocks CB4 separately. Alternatively, they may be shared by plural logic circuit blocks CB4.

The logic circuit block CB4 is an example of the stoppable circuit unit of the embodiment of the present invention. The reference voltage line VSL is an example of the first voltage line of the embodiment of the present invention. The inrush-current discharge line VNS is an example of the second voltage line of the embodiment of the present invention. The supply voltage line VDL is an example of the third voltage line of the embodiment of the present invention. The inrush-current inflow line VND is an example of the fourth voltage line of the embodiment of the present invention. The virtual reference voltage line V-VSL is an example of the first internal voltage line of the embodiment of the present invention. The virtual supply voltage line V-VDL is an example of the second internal voltage line of the embodiment of the present invention. The logic circuit cell LC4 is an example of the circuit cell of the embodiment of the present invention. The switch transistor SWns is an example of the first switch of the embodiment of the present invention. The switch transistor SWss is an example of the second switch of the embodiment of the present invention. The switch transistor SWnd is an example of the third switch of the embodiment of the present invention. The switch transistor SWdd is an example of the fourth switch of the embodiment of the present invention. The power supply pad 1ss is an example of the first power supply pad of the embodiment of the present invention. The power supply pad 1ns is an example of the second power supply pad of the embodiment of the present invention. The power supply pad 1dd is an example of the third power supply pad of the embodiment of the present invention. The power supply pad 1nd is an example of the fourth power supply pad of the embodiment of the present invention. The logic circuit block CB2 is an example of the constantly-operating circuit unit of the embodiment of the present invention. The n-type MOS transistor included in the logic circuit cell LC4 is an example of the first first-conductivity-type field effect transistor of the embodiment of the present invention. The n-type MOS transistor SWns is an example of the second first-conductivity-type field effect transistor of the embodiment of the present invention. The n-type MOS transistor SWss is an example of the third first-conductivity-type field effect transistor of the embodiment of the present invention. The p-type MOS transistor included in the logic circuit cell LC4 is an example of the first second-conductivity-type field effect transistor of the embodiment of the present invention. The p-type MOS transistor SWnd is an example of the second second-conductivity-type field effect transistor of the embodiment of the present invention. The p-type MOS transistor SWdd is an example of the third second-conductivity-type field effect transistor of the embodiment of the present invention.

As described above, the embodiments of the present invention can switch the state of a logic circuit block from the stopped state to the operating state in a short time while preventing a logic circuit block that does not employ an MTCMOS technique and constantly operates and a logic circuit block that employs the MTCMOS technique and is in the operating state from erroneously operating due to an inrush current.

This is the end of the description of embodiments of the present invention. It should be understood that various modifications and combinations desired attributed to design-related reasons and other factors are encompassed in the scope of the invention corresponding to the invention set forth in the claims and specific examples described for the embodiments of the invention.

What is claimed is:

1. A semiconductor integrated circuit comprising:
a stoppable circuit unit configured to be alternately switched between a stopped state and an operating state;
a first voltage line configured to apply a first voltage to the stoppable circuit unit when the stoppable circuit unit is in the operating state;
a second voltage line configured to apply the first voltage to the stoppable circuit unit when the stoppable circuit unit is in a transient state of switching from the stopped state to the operating state; and
a third voltage line configured to apply a second voltage to the stoppable circuit unit; wherein
the stoppable circuit unit includes
a circuit cell connected between the third voltage line and an internal voltage line,
a first switch that isolates the second voltage line from the internal voltage line when the stoppable circuit unit is in the stopped state, and connects the second voltage line to the internal voltage line when the stoppable circuit unit is in the transient state, and
a second switch that isolates the first voltage line from the internal voltage line when the stoppable circuit unit is in the stopped state and when the stoppable circuit unit is in the transient state, and connects the first voltage line to the internal voltage line when the stoppable circuit unit is in the operating state,
wherein:
the circuit cell includes a first field effect transistor of a predetermined conductivity type, having a first threshold voltage;
the first switch includes a second field effect transistor of the predetermined conductivity type, having a second threshold voltage higher than the first threshold voltage; and
the second switch includes a third field effect transistor of the predetermined conductivity type, having a third threshold voltage higher than the first threshold voltage,
wherein:
a channel width of the second field effect transistor is smaller than a channel width of the third field effect transistor; and
a width of the second voltage line is smaller than a width of the first voltage line.

2. The semiconductor integrated circuit according to claim 1, wherein
the first voltage line is connected to a first power supply pad for a connection to an external power supply;
the second voltage line is connected to a second power supply pad for a connection to the external power supply; and
the third voltage line is connected to a third power supply pad for a connection to the external power supply.

3. The semiconductor integrated circuit according to claim 1, further comprising:
a constantly-operating circuit unit configured to be connected between the first voltage line and the third voltage line and be unable to be switched to the stopped state; wherein
the first voltage line is used to apply the first voltage to the constantly-operating circuit unit; and
the third voltage line is used to apply the second voltage to the constantly-operating circuit unit.

4. The semiconductor integrated circuit according to claim 3, wherein at least two of the stoppable circuit units are connected to the same second voltage line; and
the constantly-operating circuit unit includes a controller that switches the stoppable circuit units from the stopped state to the operating state, one unit by one unit with time lag.

5. A semiconductor integrated circuit comprising:
a constantly-operating circuit unit constantly connected to a supply voltage line and a reference voltage line;
a stoppable circuit unit selectively connectable to said supply voltage line or said reference voltage line, operation of said stoppable circuit unit being switchable between a stopped state and an operating state,
wherein a virtual reference voltage line is present within said stoppable circuit unit, said virtual reference voltage line being absent from said constantly-operating circuit unit,
wherein said stoppable circuit unit includes logic circuit cells, said logic circuit cells being connected to said virtual reference voltage line and said supply voltage line,
wherein said virtual reference voltage line is connected to an inrush-current discharge line when transitioning from said stopped state to said operating state.

6. The semiconductor integrated circuit according to claim 5, wherein a width of said inrush-current discharge line is smaller than a width of said reference voltage line.

7. The semiconductor integrated circuit according to claim 5 wherein said virtual reference voltage line is connected to said reference voltage line during said operating state.

8. A semiconductor integrated circuit comprising:
a constantly-operating circuit unit constantly connected to a supply voltage line and a reference voltage line;
a stoppable circuit unit selectively connectable to said supply voltage line or said reference voltage line, operation of said stoppable circuit unit being switchable between a stopped state and an operating state,
wherein a virtual supply voltage line is present within said stoppable circuit unit, said virtual supply voltage line being absent from said constantly-operating circuit unit,
wherein said stoppable circuit unit includes logic circuit cells, said logic circuit cells being connected to said virtual supply voltage line and said reference voltage line,
wherein said virtual supply voltage line is connected to an inrush-current inflow line when transitioning from said stopped state to said operating state.

9. The semiconductor integrated circuit according to claim 8, wherein a width of said inrush-current inflow line is smaller than a width of said supply voltage line.

10. The semiconductor integrated circuit according to claim 8, wherein said virtual supply voltage line is connected to said supply voltage line during said operating state.

11. A semiconductor integrated circuit comprising:
a constantly-operating circuit unit constantly connected to a supply voltage line and a reference voltage line;
a stoppable circuit unit selectively connectable to said supply voltage line or said reference voltage line, operation of said stoppable circuit unit being switchable between a stopped state and an operating state, wherein a virtual reference voltage line and a virtual supply voltage line are present within said stoppable circuit unit, said virtual reference voltage line and said virtual supply voltage line being absent from said constantly-operating circuit unit, wherein said stoppable circuit unit includes logic circuit cells, said logic circuit cells being connected to said virtual reference voltage line and said virtual supply voltage line, wherein said virtual supply voltage line is connected to said supply voltage line during said operating state, wherein said virtual supply voltage line is connected to an inrush-current inflow line when transitioning from said stopped state to said operating state.

12. The semiconductor integrated circuit according to claim 11, wherein a width of said inrush-current inflow line is smaller than a width of said supply voltage line.

13. The semiconductor integrated circuit according to claim 11, wherein said virtual reference voltage line is connected to said reference voltage line during said operating state.

14. A semiconductor integrated circuit comprising:
a constantly-operating circuit unit constantly connected to a supply voltage line and a reference voltage line;
a stoppable circuit unit selectively connectable to said supply voltage line or said reference voltage line, operation of said stoppable circuit unit being switchable between a stopped state and an operating state., wherein a virtual reference voltage line and a virtual supply voltage line are present within said stoppable circuit unit, said virtual reference voltage line and said virtual supply voltage line being absent from said constantly-operating circuit unit, wherein said stoppable circuit unit includes logic circuit cells, said logic circuit cells being connected to said virtual reference voltage line and said virtual supply voltage line, wherein said virtual reference voltage line is connected to an inrush-current discharge line when transitioning from said stopped state to said operating state.

15. The semiconductor integrated circuit according to claim 14, wherein a width of said inrush-current discharge line is smaller than a width of said reference voltage line.

16. The semiconductor integrated circuit according to claim 14, wherein said virtual reference voltage line is connected to said reference voltage line during said operating state.

* * * * *